United States Patent [19]
Tihanyi

[11] 4,344,080
[45] Aug. 10, 1982

[54] FIELD EFFECT TRANSISTOR

[75] Inventor: Jenö Tihanyi, Munich, Fed. Rep. of Germany

[73] Assignee: Siemens Aktiengesellschaft, Berlin and Munich, Fed. Rep. of Germany

[21] Appl. No.: 99,605

[22] Filed: Dec. 3, 1979

[30] Foreign Application Priority Data

Dec. 5, 1978 [DE] Fed. Rep. of Germany ....... 2852621

[51] Int. Cl.³ ........................................... H01L 29/72
[52] U.S. Cl. ...................................... 357/23; 357/41; 357/46; 357/55
[58] Field of Search ........................ 357/23, 41, 46, 55

[56] References Cited

U.S. PATENT DOCUMENTS

| | | | |
|---|---|---|---|
| 4,129,880 | 12/1978 | Vinal | 357/23 |
| 4,172,260 | 10/1979 | Okabe et al. | 357/23 |
| 4,247,860 | 1/1981 | Tihanyi | 357/23 |

Primary Examiner—Edward J. Wojciechowicz
Attorney, Agent, or Firm—Herbert L. Lerner; Laurence A. Greenberg

[57] ABSTRACT

Field effect transistor having a semiconductor substrate of a first conduction type, a source and a drain of a conduction type opposite the first conduction type, a zone of the opposite conduction type disposed between the source and the drain and surrounded by a region of the first conduction type and doped more heavily than the substrate and a control electrode insulated from the surface of the semiconductor substrate and covering the zone disposed between the source and the drain over the entire width thereof includes a drift section for charge carriers forming part of the zone disposed between the source and the drain and located between the control section and the drain, the drift section containing dopant atoms increasing in number in direction from the control electrode toward the drain.

9 Claims, 8 Drawing Figures

FIELD EFFECT TRANSISTOR

The invention relates to a field effect transistor having a semiconductor substrate of a first conduction type, a source and a drain of a conduction type opposite the first conduction type, a zone of the opposite conduction type disposed between the source and the drain and doped more weakly than the source and the drain, the zone between the source and the drain being surrounded by a region of the first conduction type and being doped more heavily than the substrate, a control electrode insulated from the surface of the semiconductor substrate and covering the zone between the source and the drain over the entire width thereof, part of the zone lying between the control electrode and the drain forming a drift section or path for charge carriers.

Such a field effect transistor has become known heretofore. Field effect transistors of this type are generally designed for operating voltages of 50 to 100 V. The use of higher operating voltage has failed so far because the field strength in the current-carrying channel between the control electrode and the drain has become so high that an avalanche breakthrough has occurred.

Attempts have been made to counterpart an increase of the field strength between the control electrode and the drain to a critical value at which the avalanche breakthrough is incited, by disposing one or more auxiliary electrodes above the current-carrying channel from the control electrode to the drain at an increasing distance from the surface of the substrate. This necessitates a stepped construction of the insulating layer applied to the substrate as well as the application of auxiliary voltages to the auxiliary electrodes.

It is accordingly an object of the invention to provide a field effect transistor according the hereinaforementioned type which is constructed so that it can be used at higher operating voltages without a need for auxiliary electrodes and auxiliary voltage sources. It is another object of the invention to provide such a field effect transistor with a structure which is integratable without great expense.

With the foregoing and other objects of the invention, there is provided a field effect transistor having a semiconductor substrate of a first conduction type, a source and a drain of a conduction type opposite the first conduction type, a zone of the opposite conduction type disposed between the source and the drain and surrounded by a region of the first conduction type and doped more heavily than the substrate and a control electrode insulated from the surface of the semiconductor substrate and covering the zone disposed between the source and the drain over the entire width thereof comprising a drift section for charge carriers forming part of the zone disposed between the source and the drain and located between the control section and the drain, the drift section containing dopant atoms increasing in number in direction from the control electrode toward the drain.

The most important embodiment of this principle is that the drift section has a substantially constant doping and that the drift section widens from the control electrode to the drain to a value which is equal to a multiple of the width of the drain. This is advantageously achieved, in accordance with other features of the invention, either by making the control electrode in the form of a strip and widening the zone toward the drain, or by providing the zone with constant width and the control electrode with a recess or cutout which widens toward the drain.

In accordance with another feature of the invention, the drift section has a substantially constant doping and widens from the control electrode toward the drain to an extent which is several times the width of the drain.

In accordance with a further feature of the invention, the control electrode is formed as a strip, and the zone disposed between the source and the drain widens toward the drain.

In accordance with an additional feature of the invention, a multiplicity of sources and the drains are disposed adjacent one another and electrically connected to one another, the drift section forming a drift region common to all of the sources and the drains and forming part of a multiplicity of zones disposed between the sources and the drains, and the strip-shaped control electrode covers all of the multiplicity of zones.

In accordance with an added feature of the invention, the zone disposed between the source and the drain has a constant width, and the control electrode is formed with a cutout widening in direction toward the drain.

In accordance with yet another feature of the invention, the drift section widens in a funnel-shaped manner, and has an aperture angle of between 20° and <180°.

In accordance with yet a further feature of the invention, there is provided an additional zone of the first conduction type interrupting the zone disposed between the source and the drain, the additional zone being at least partly covered by the control electrode has a dopant concentration which is at least as heavy as that of the substrate.

In accordance with yet an additional feature of the invention, there is provided a multiplicity of drains adjacent one another and electrically connected to one another, a strip-shaped source common to all the drains, the drift section forming a drift region common to all of the drains and forming part of a multiplicity of zones disposed between the strip-shaped source and the drains, and a strip-shaped additional zone of the first conduction type disposed between the source and the drains and interrupting the common drift region, the additional zone having a dopant concentration which is at least as heavy as that of the substrate, the control electrode being also strip-shaped and covering the common drift region, the control electrode being formed with cutouts disposed opposite the drains and corresponding in number to the number of the drains.

In accordance with yet an added feature of the invention, there is provided a multiplicity of drains adjacent one another and electrically connected to one another, a strip-shaped source common to all the drains, the drift section forming a drift region common to all of the drains and forming part of a multiplicity of zones disposed between the strip-shaped source and the drains, the drift region surrounding the source, and an additional zone of the first conduction type interrupting the commong drift region and having a dopant concentration at least as great as that of the substrate, the control electrode surrounding the source and being formed with cutouts disposed opposite the drains and corresponding in number to the number of drains.

In accordance with a still further feature of the invention, the drift section is of substantially constant width, and the dopant concentration thereof increases in direction from the control electrode toward the drain.

Other features which are considered as characteristic for the invention are set forth in the appended claims.

Although the invention is illustrated and described herein as embodied in field effect transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings in which.

Figure 1:
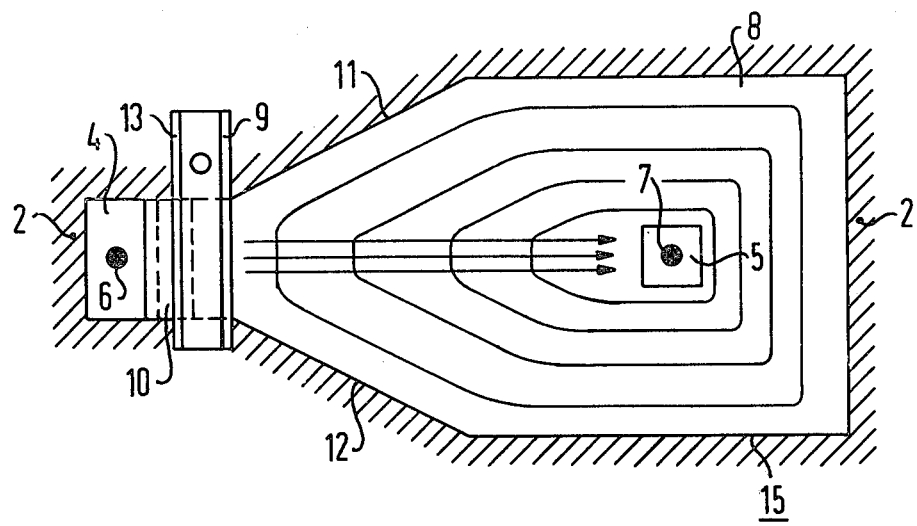
FIGS. 1 and 2 are, respectively, diagrammatic top plan and vertical sectional views of a first embodiment of the field effect transistor, according to the invention wherein an hereinaforementioned zone of opposite conduction type becomes wider toward the drain.
Figure 2:
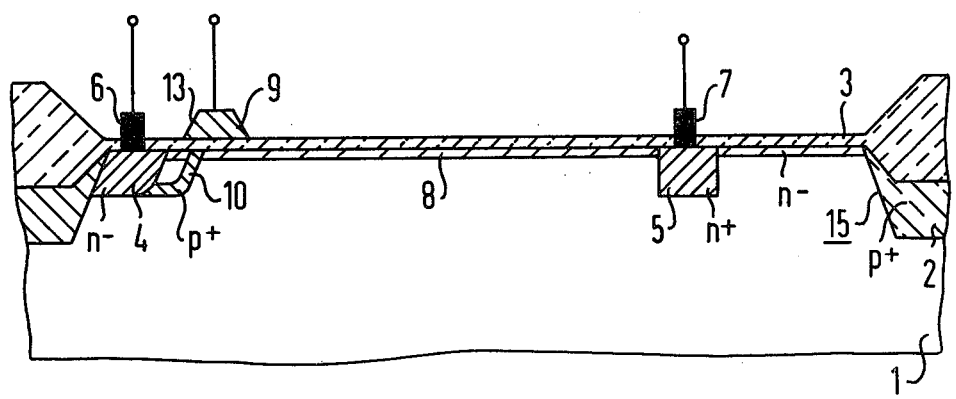

Referring now to the drawing and first, particularly, to FIGS. 1 and 2, a top plan view of and a cross-sectional view, respectively, of a field effect transistor (FET) for higher operating voltages are shown. The FET has a substrate 1 formed, for example, of weakly p-doped silicon. The FET is delineated by a heavily p-doped zone 2 which is shown hatched for better clarity and is continued outwardly. In the substrate 1, a source 4 and a drain 5 with high n-conductivity are disposed. A weakly n-doped zone 8 is situated between the source 4 and the drain 5. The surface of the semiconductor substrate is covered with an insulating layer 3 formed of silicon dioxide. In the vicinity of the source 4, a control electrode 9, which may be formed of polycrystalline silicon, is disposed on the insulating layer 3. In FIG. 1 and in all other top plan views, the insulating layer 3 has been omitted for better clarity.

The weakly n-doped zone 8 is interrupted in the vicinity of the source 4 by a heavily p-doped zone 10. The zone 10 and the source 4 are produced by double ion implantation. The designation "DIMOS-FET" is also used for such a structure. The control electrode serves as a mask and, for this purpose, has an inclined flank 13, the zone 10 being given the illustrated shape falling off at an inclination as shown and then assuming a horizontal course at a depth of the substrate 1 determined by the size or quantity of the implanted ions and the energy thereof. This zone 10 is not absolutely necessary for the FET to function, if complete cut-off of the current-carrying channel located between the source 4 and the drain 5 is dispensed with. The FET can then be used as a controlled resistance in a complex of integrated semiconductor components.

The zone 8 forms a drift section for the electrons coming from the source 4 between the control electrode 9 and the drain 5. The drift section 8 is enlarged or widened, starting from the control electrode 9, to a width which is several times greater than the width of the drain 5. The drift section 8 is terminated or limited by a p-n junction 15. The widening part of the drift section 8 is defined by edges 11 and 12 of the p-n junction 15, which enclose an angle of between 30° and 90° therebetween. The distance from the control electrode 9 to the drain 5 can be, for example, 5 to 100 μm and the greatest width of the drift section 8 may be from 10 to 100 μm. The angle can also vary over a greater range between 20° and <180°. The following dimensions have been found to be particularly advantageous: distance, 50 μm; greatest width, 30 μm; angle, 45°; width of the zone 8 under the control electrode, 5 μm. The control electrode may be from 2 to 10 μm wide.

If a voltage is applied to the electrodes 6 and 7, a current begins to flow from the source 4 to the drain 5, dependent upon the magnitude of the control voltage applied to the control electrode 9. In accordance with the magnitude of the voltage applied between the electrodes 6 and 7, equipotential lines develop which have the shape shown in FIG. 1. The charge carriers then take the path indicated by the arrows to the drain 5. It is apparent that the equipotential lines have the greatest spacing in the region of the current-carrying channel indicated by the arrows. This means that the field strength is lowest thereat and the danger of an avalanche break-through is accordingly reduced. Due to the widening of the drift section 8, the field strength in all other regions between the heavily doped zone 2 and the drain 5 is also reduced.

Figure 3:
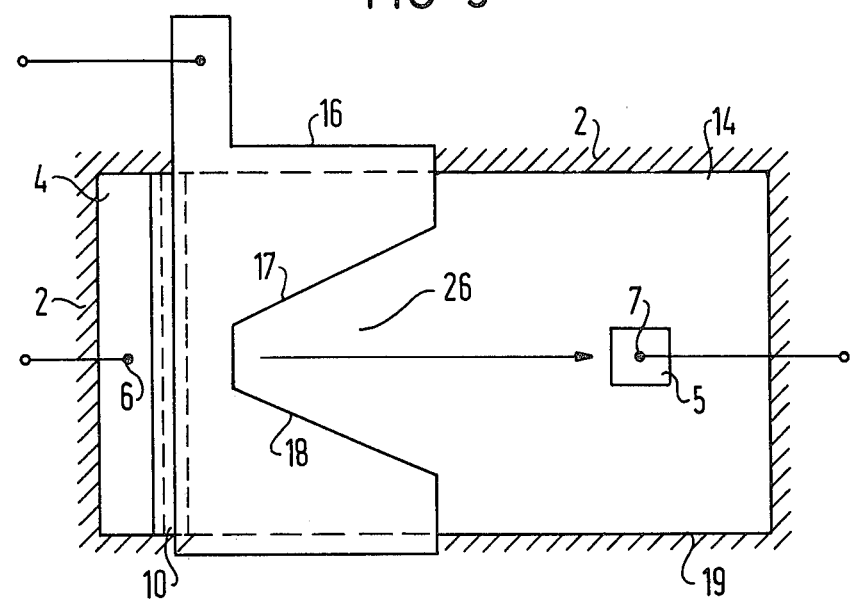
FIG. 3 is a top plan view of a further embodiment of the invention in which the zone of opposite conduction type is of constant width and the widening of the drift section is formed by a recess of the control electrode widening toward the drain.

The device according to FIG. 3 has a weakly n-doped zone 14 of constant width. It is limited or defined by the p-n junction 19. The source 4 is as wide as the zone 14. The control electrode 16 is formed with a cutout or recess 26 widening toward the drain 5 and having lateral edges 17 and 18 defining an angle of from 30° to 90° therebetween. The edges 17 and 18 determine the course of the equipotential lines, which attain the shape shown in FIG. 1. Also in this FET of FIG. 3, a drift section is therefore provided which widens from the control electrode 16 to the drain 5 to an extent equalling several times the width of the drain 5. Also, this drift section contains an increasing number of dopant atoms in direction from the control electrode 16 toward the drain 5, and a reduction of the field strength between the control electrode 16 and the zone 2, respectively, and the drain 5 is achieved.

Figure 4:
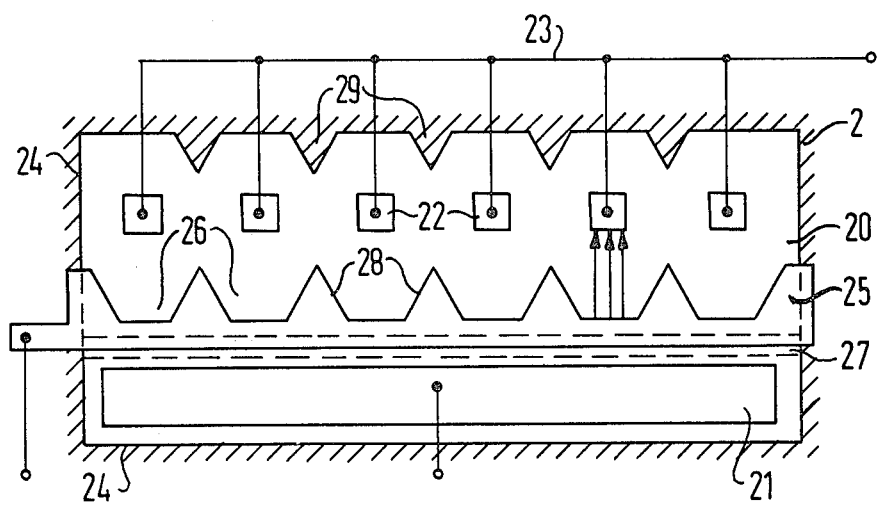
FIG. 4 is a top plan view of a multiple arrangement of the field effect transistor embodiment employing the principle of construction according to FIG. 3.

In FIG. 4, there is shown an integrated FET resulting from multiple reproduction of the FET illustrated in FIG. 3. The integrated FET has a plurality of drains 22 which are connected together electrically by a common line 23. The drift sections of this FET of FIG. 4 form a common drift zone 20 which may be slightly n-doped as in the hereinaforedescribed embodiment. The source 21 is in the form of a strip 21 and is located opposite all of the drains 22. This is true also for the heavily n-doped zone 27 which interrupts the weakly n-doped zone. The control electrode 25 covers the entire width of the drift region 20 and is provided with a number of cutouts or recesses 26 corresponding to the number of drains 22. The cutouts 26 are located opposite the individual drains 22, respectively, and are defined by edges 28 which enclose an angle of from 30° to 90° therebetween, as mentioned hereinbefore. The drift region 20 is enclosed or surrounded by a p-n junction 24. The p-n junction 24 on the side thereof separated from the control electrode 25 by the drains 22, is provided with projections 29, respectively, situated between respective pair of the drains 22. These projections 29 influence the course of the equipotential lines behind the drains 22. They can be constructed so that the space between each pair of these projections 29 in the region 20 approximately corresponds to the cutouts or recesses 26 formed in the control electrode 25.

Figure 5:
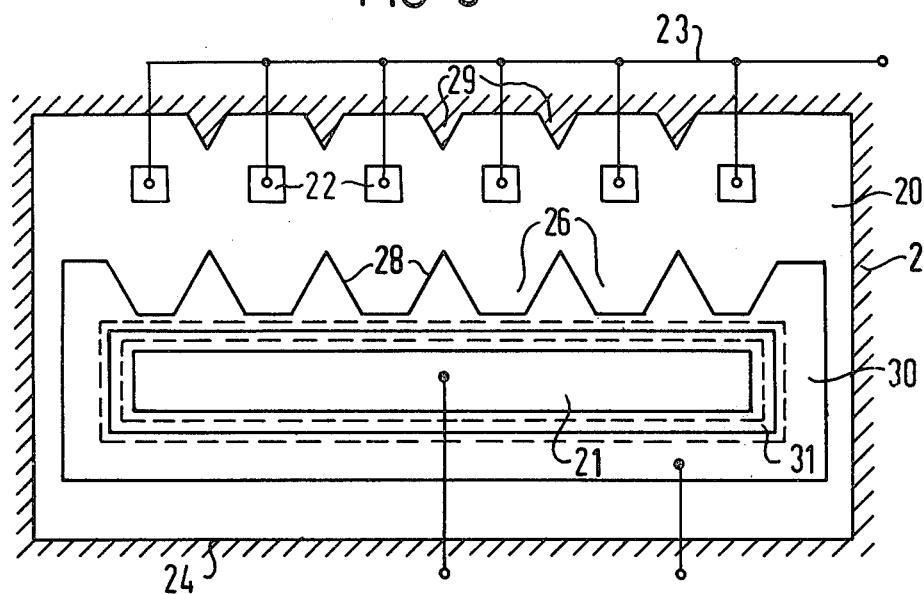
FIG. 5 is a top plan view of a further embodiment of the multiple arrangement according to FIG. 4.

The FET according to FIG. 5 differs from that of FIG. 4 primarily in that the heavily p-doped zone 3 in FIG. 25 (27 in FIG. 4) interrupting the weakly n-conducting region, as well as the control electrode 30, encloses the source 21 from all sides. This embodiment of FIG. 5 is preferably used if a very high voltage is to be applied between the source 21 and the control electrode 30.

Figure 6:
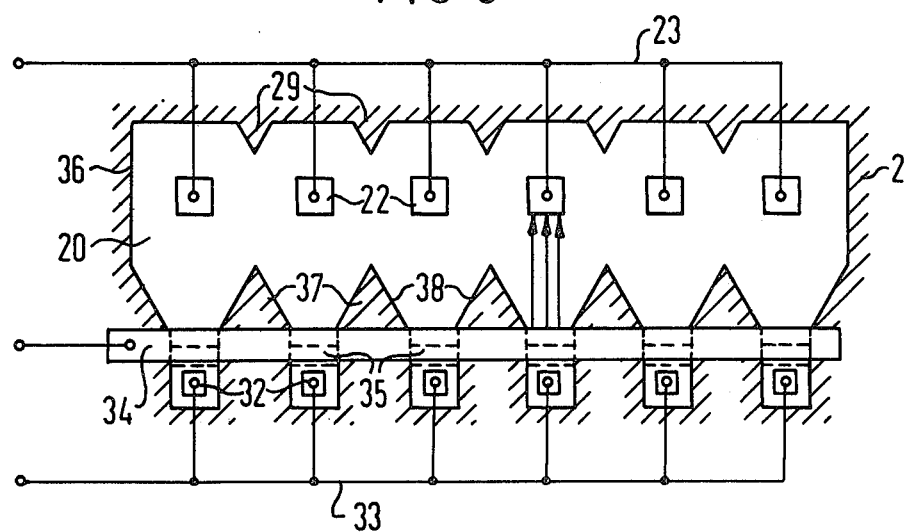
FIG. 6 is a top plan view of a multiple arrangement of the embodiment employing the construction principle according to FIGS. 1 and 2.

In FIG. 6, an integrated FET is shown which is formed of a multiplicity of the structures shown in FIGS. 1 and 2. This FET of FIG. 1 has a multiplicity of sources 32 which are electrically connected to one another by a common line 33. Between the source 32 and the drift region 20, a multiplicity of heavily p-doped additional zones 35 are disposed, the function of which corresponds to that of the zone 10 in FIG. 1. A strip-shaped control electrode 34 is disposed between the sources 32 and the drift region 20. The common region 20 is surrounded by a p-n junction 36, which also encloses the sources 32. The p-n junction 36 has projections 37 which are situated, respectively, between pairs of the respective sources 32 and form drift sections for the charge carriers, widening in direction toward the drains 22. The projections 37 are defined by edges 38, which correspond to the edges 11 and 12 in FIG. 1.

What was stated hereinbelow with respect to the dimensions of the individual drift regions in connection with FIGS. 1 and 2, is equally applicable to FIG. 6. Currents of, for example, 10 mA at voltages of 100 to 200 V are attainable for one of the integrated FET structures according to FIG. 4, 5 or 6.

In the hereinaforedescribed embodiments, it was explained, the drift sections become wider in direction toward the drain or drains. This means an increase of the doping material or dopant atoms in direction toward the drain or drains with the advantageous result that the field strength between the control electrode and the drain and between the heavily p-doped zone and the drain is reduced. However, it is also possible to provide the drift section with constant width and with a dopant concentration increasing in a gradual or step-wise manner in direction toward the drain. Sufficient change carriers are accordingly available along the entire length of the current-carrying channel to prevent an increase of the field strength to a value at which there would be danger of inciting an avalanche breakthrough. In principle, it would also be possible to provide the drift section with a number of doping-material or dopant atoms increasing in direction toward the drain by increasing the thickness thereof between the control electrode and the drain. However, no technology for preparing such a drift section is presently in sight.

There is claimed:

1. Field effect transistor having a semiconductor substrate with a predominant region of a first conduction type, a source and a drain of a conduction type opposite the first conduction type, a zone of the opposite conduction type disposed between the source and the drain and surrounded by another region of the first conduction type and doped more heavily than the predominant region of the substrate and a control electrode insulated from the surface of the semiconductor substrate comprising a drift section for charge carriers forming part of the zone disposed between the source and the drain and located between the control electrode and the drain, said drift section having a substantially constant doping and widening from the control electrode towards the drain to a width which is a plurality of times greater than the width thereof at the control electrode.

2. Field effect transistor according to claim 1 wherein the control electrode is formed as a strip, and spans said drift section near the source.

3. Field effect transistor according to claim 2 wherein a multiplicity of sources and the drains are disposed adjacent one another and electrically connected to one another, the drift section forms a drift region common to all of the sources and the drains and forming part of a multiplicity of zones disposed between the sources and the drains, and the strip-shaped control electrode spans all of the multiplicity of zones.

4. Field effect transistor according to claim 1 wherein the drift section widens in a funnel-shaped manner, and has an aperture angle of between 20° and <180°.

5. Field effect transistor according to claim 1 including an additional zone of the first conduction type interrupting the zone disposed between the source and the drain, said additional zone being at least partly covered by the control electrode and having a dopant concentration which is at least as heavy as that of the substrate.

6. Field effect transistor according to claim 1 including a multiplicity of drains adjacent one another and electrically connected to one another, a strip-shaped source common to all the drains, the drift section forming a drift region common to all of the drains and forming part of a multiplicity of zones disposed between the strip-shaped source and the drains, said drift region surrounding the source, and an additional zone of the first conduction type interrupting said common drift region and having a dopant concentration at least as great as that of the substrate, the control electrode surrounding the source and being formed with cutouts disposed opposite the drains and corresponding in number to the number of drains.

7. Field effect transistor having a semiconductor substrate with a predominant region of a first conduction type, a source and a drain of a conduction type opposite the first conduction type, a zone of the opposite conduction type disposed between the source and the drain and surrounded by another region of the first conduction type and doped more heavily than the predominant region of the substrate and a control electrode insulated from the surface of the semiconductor substrate comprising a drift section for charge carriers forming part of the zone disposed between the source and the drain and located between the control electrode and the drain, the zone disposed between the source and the drain and formed of said drift region having a constant width, and the control electrode being formed with a cutout widening in direction toward the drain.

8. Field effect transistor according to claim 7 including a multiplicity of drains adjacent one another and electrically connected to one another, a strip-shaped source common to all the drains, the drift section forming a drift region common to all of the drains and forming part of a multiplicity of zones disposed between the strip-shaped source and the drains, and a strip-shaped additional zone of the first conduction type disposed between the source and the drains and interrupting said common drift region, said additional zone having a dopant concentration which is at least as heavy as that of the substrate, the control electrode being also strip-shaped and covering said common drift region, the control electrode being formed with cutouts disposed opposite the drains and corresponding in number to the number of the drains.

9. Field effect transistor according to claim 8 wherein the cutouts have an aperture angle between 20° and <180°.